(12) United States Patent
Iwase et al.

(10) Patent No.: US 9,310,688 B2
(45) Date of Patent: Apr. 12, 2016

(54) PROCESSING APPARATUS AND ARTICLE MANUFACTURING METHOD USING SAME

(71) Applicant: CANON KABUSHIKI KAISHA, Tokyo (JP)

(72) Inventors: Daisuke Iwase, Utsunomiya (JP); Nobushige Korenaga, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 377 days.

(21) Appl. No.: 14/045,880

(22) Filed: Oct. 4, 2013

(65) Prior Publication Data

US 2014/0111780 A1 Apr. 24, 2014

(30) Foreign Application Priority Data

Oct. 23, 2012 (JP) ................................. 2012-233558

(51) Int. Cl.
| | |
|---|---|
| A61N 5/00 | (2006.01) |
| F16M 13/00 | (2006.01) |
| G03B 27/32 | (2006.01) |
| G03B 27/52 | (2006.01) |
| G03F 7/26 | (2006.01) |
| B23Q 3/02 | (2006.01) |
| G21K 5/08 | (2006.01) |
| G03F 7/20 | (2006.01) |

(52) U.S. Cl.
CPC .. *G03F 7/26* (2013.01); *B23Q 3/02* (2013.01); *G03F 7/709* (2013.01); *G03F 7/70833* (2013.01); *G03F 7/70841* (2013.01); *G21K 5/08* (2013.01)

(58) Field of Classification Search
CPC ... B23Q 3/02; G03F 7/70808; G03F 7/70816; G03F 7/70833; G03F 7/70841; G03F 7/709; G21K 5/08

USPC .................. 248/596, 638; 250/492.2; 269/57; 355/27, 30, 67, 77
See application file for complete search history.

(56) References Cited

U.S. PATENT DOCUMENTS

| | | | | |
|---|---|---|---|---|
| 5,746,562 | A | * | 5/1998 | Hasegawa ........... G03F 7/70808 248/638 |
| 6,774,374 | B1 | | 8/2004 | Driessen et al. |
| 2003/0082466 | A1 | * | 5/2003 | del Puerto ............... G03F 7/707 430/22 |

FOREIGN PATENT DOCUMENTS

| | | |
|---|---|---|
| JP | 2000340502 A | 12/2000 |
| JP | 2009099723 A | 5/2009 |

* cited by examiner

*Primary Examiner* — Colin Kreutzer
(74) *Attorney, Agent, or Firm* — Rossi, Kimms & McDowell LLP

(57) ABSTRACT

A processing apparatus configured to conduct a prescribed processing on an object to be processed in a specific environment, the processing apparatus comprising: a chamber configured to have an aperture and an interior accommodated to a specific environment; a mechanism of which at least a portion is contained within the chamber interior, while a remaining portion passes through the aperture without contacting the chamber; at least one support member configured to support the mechanism; a sealing member that configures a boundary of the specific environment and an atmospheric environment by connecting one end to the aperture and connecting the other end to the support member; and a rotary member configured to allow relative rotation around a vertical axis between the support member and a structure that supports the support member.

17 Claims, 1 Drawing Sheet

PROCESSING APPARATUS AND ARTICLE MANUFACTURING METHOD USING SAME

BACKGROUND OF THE INVENTION

1. Field of the Invention

The present invention relates to a processing apparatus using a sealing member an article manufacturing method using same.

2. Description of the Related Art

In the lithography process included in the manufacturing process of semiconductor devices and the like, a desired pattern is formed on a object to be processed via a lithography apparatus such as an exposure apparatus or a drawing apparatus that uses charged particle beam. In particular, drawing apparatuses and the EUV exposure apparatuses that are being developed as a next-generation semiconductor exposure apparatuses are also classified as vacuum processing apparatuses, because processing operations are conducted in a vacuum environment. In such apparatuses, the interior of a vacuum chamber is equipped with a support structure that supports a lens barrel containing a projection optical system or an electron optical system, an interferometer that measures various positions, and the like; or a stage which holds and moves an original pattern (reticle or the like) or a object to be processed (wafer or the like). When deformation of the chamber itself due to an air pressure difference between the interior and exterior of this chamber, or vibration from the floor surface or stage via the chamber is propagated to the support structure, various types of precision are affected. In order to suppress chamber deformation or vibration that could be propagated to the support structure, the chamber is supported on a base plate that is disposed on the floor surface with interposition of mounts (vibration-proofing mechanisms). In addition, support columns of the stage pass through apertures provided in the chamber without contact, and are directly supported by the base plate. Particularly in this case, it is necessary to establish the chamber interior as a sealed space, and to install sealing members (sealing mechanisms) that take into account the suppression of deformation or vibration that could also be propagated from these apertures. Japanese Patent Application Laid-Open No. 2009-99723 discloses an exposure apparatus which adopts a bellows (extendable pipe) as this type of sealing member. Furthermore, Japanese Patent Application Laid-Open No. 2000-340502 discloses a lithography apparatus which adopts a low-rigidity seal of a differential evacuation system as the sealing mechanism.

However, in the case where a bellows is used, as in the exposure apparatus shown in Japanese Patent Application Laid-Open No. 2009-99723, it is possible that the support structure may sustain deformation or vibration from the bellows depending on the form of chamber deformation or the vibration transmission direction, because there is a high rigidity in the rotational direction around the axis that parallels the direction of extension or contraction of the bellows. Furthermore, it is difficult to maintain a vacuum within a vacuum chamber in the case where a low-rigidity seal is used, as in the lithography apparatus shown in Japanese Patent Application Laid-Open No. 2000-340502.

SUMMARY OF THE INVENTION

The present invention was made in light of these circumstances, and provides a processing apparatus which is advantageous for mitigating deformation, vibration, and the like that can be propagated via a chamber that has been internally accommodated to a specific environment.

An aspect of the present invention is a processing apparatus configured to conduct a prescribed processing on an object to be processed in a specific environment, the processing apparatus comprising: a chamber configured to have an aperture and an interior accommodated to a specific environment; a mechanism of which at least a portion is contained within the chamber interior, while a remaining portion passes through the aperture without contacting the chamber; at least one support member configured to support the mechanism; a sealing member that configures a boundary of the specific environment and an atmospheric environment by connecting one end to the aperture and connecting the other end to the support member; and a rotary member configured to allow relative rotation around a vertical axis between the support member and a structure that supports the support member.

According to the present invention, it is possible to provide a processing apparatus which is advantageous for mitigating deformation or vibration that could be propagated by a chamber that has been internally accommodated to a specific environment.

Further features of the present invention will become apparent from the following description of exemplary embodiments with reference to the attached drawings.

DESCRIPTION OF THE EMBODIMENTS

Hereinafter, preferred embodiments of the present invention will be described with reference to the drawings.

First Embodiment

Firstly, a processing apparatus of a first embodiment of the present invention will be described. As one example, the processing apparatus described in the present embodiment is a lithography apparatus adopted in a lithography process included in the manufacturing process of a semiconductor device or the like, or in manufacture of an original plate (reticle or the like) used in an exposure apparatus. More particularly, the processing apparatus of the present embodiment is a drawing apparatus which conducts drawing on a substrate using electron beams (charged particle beam) in a vacuum (specific) environment. A drawing apparatus draws a prescribed pattern at a prescribed position of a substrate by deflecting a single or multiple electron beams, and by controlling the blanking of the electron beam(s) (the turning OFF of radiation). Now, charged particle beam is not limited to the electron beams of the present embodiment, and may also include other charged particle beam such as ion beams.

Figure 1:
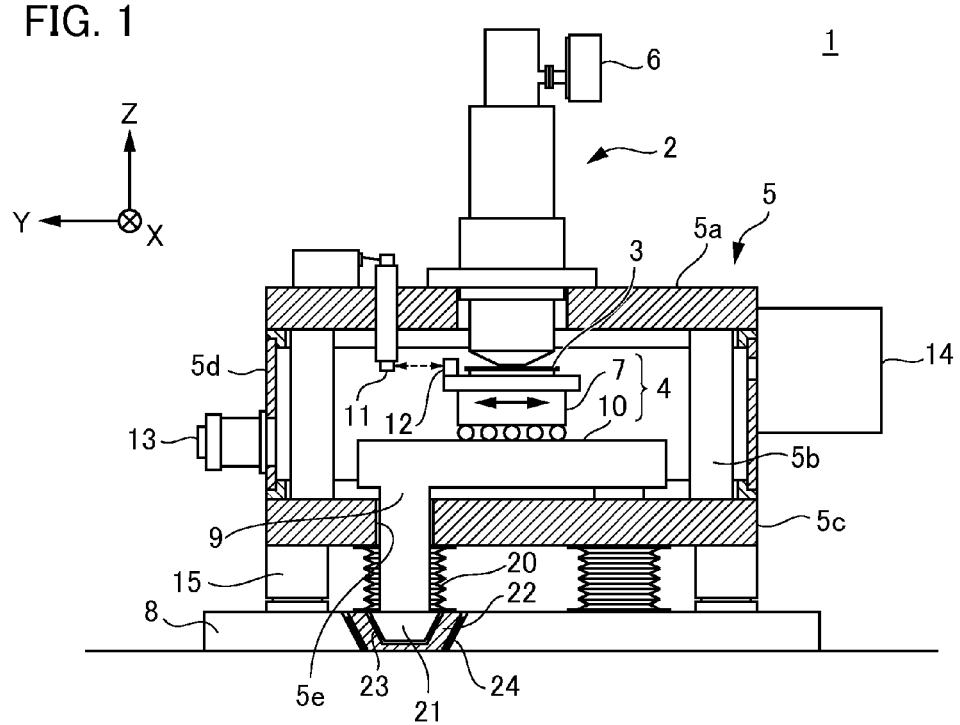
FIG. 1 is a diagram illustrating a configuration of a drawing apparatus of a first embodiment of the present invention.

FIG. 1 is a schematic view illustrating a configuration of a drawing apparatus 1 of the present embodiment. In FIG. 1, a Z axis is adopted in the direction of electron beam radiation (the vertical direction in the present embodiment) relative to the substrate, and an X axis and a Y axis are adopted that are mutually orthogonal within a plane that is vertical to the Z axis. The drawing apparatus 1 is provided with, firstly, a lens barrel 2 which internally contains an electron source, and an optical system that at least deflects and images electron beams produced from the electron source; a chamber 5 in the interior of which a substrate stage 4 that holds a substrate 3 is disposed; and a control unit that is not illustrated in the drawing. The substrate 3 is a object to be processed such as a glass plate, or a wafer consisting of, for example, single-crystal silicon, and a photosensitive resist is applied to its surface.

The electron source contained in the lens barrel 2 is not illustrated in the drawing, but is a so-called thermionic electron source contained in an electron emission unit such as a cathode electrode of the dispenser cathode type. This electron source emits electrons by heating a cathode electrode to 1250-1450 K. With respect to the emitted thermions, the beam current amount is controlled, and voltage of several kV is applied by a separately installed anode electrode to conduct acceleration and dispersion as an electron beam from crossover. The optical system contained in the lens barrel 2 is not illustrated in the drawing, but is an electron optical system which irradiates the substrate 3 that is placed and held on the substrate stage 4 with electron beams emitted from the electron source. This optical system may include in order from the electron source side, for example, a first electrostatic lens, a blanking deflector, a blanking diaphragm, a deflector, a second electrostatic lens, and so on. The first electrostatic lens is a lens configured from three electrode plates having circular apertures, and causes imaging (convergence) of electron beams onto the blanking deflector. The blanking deflector conducts ON (non-blanking status) and OFF (blanking status) operations with respect to electron beam radiation. The blanking diaphragm shields the desired deflected electron beam(s) among the electron beams that transit the blanking deflector. The deflector deflects (scans) electron beams in the X axis direction onto the surface of the substrate 3. Furthermore, the second electrostatic lens causes imaging (convergence) of the electron beams that transit the deflector onto the substrate 3. Now, the electron beams are immediately attenuated by atmospheric pressure, and with the sense also of preventing high-voltage discharge, the interior of the lens barrel 2 is subjected to adjustment of internal pressure by a first vacuum pump (vacuum exhaust system) 6. In particular, the interior of the lens barrel 2 is maintained at a high degree of vacuum. Specifically, the degree of vacuum is, for example, $10^{-4}$ Pa or less in a state where there is no electron beam radiation.

The substrate stage (holding unit) 4 holds the substrate 3 by electrostatic adsorption, and includes a mobile body 7 that is capable of movement in at least the two axial directions of XY. This mobile body 7 moves using a stage surface plate 10 as a fixed member that is supported on a base plate (structure) 8 laid on a floor surface with interposition of multiple (for example, 4) support columns 9. Furthermore, a travel position of the mobile body 7 is measured by having an interferometer (measurement unit) 11 irradiate a reference mirror 12 fixed to the side of the mobile body 7 with a laser such as helium neon, and receive the reflected light. From the standpoint of maintaining measurement accuracy, the interferometer 11 is preferably positioned at a site where reception of external disturbance such as vibration is minimized. Thus, the interferometer 11 is disposed on the bottom surface (the surface on the vacuum side) of a below-described upper surface plate 5a of the chamber 5 where a position relative to the lens barrel 2 is easily adjusted so that measurement of a travel position of the mobile body 7 can be conducted using the lens barrel 2 as reference.

The chamber (vacuum chamber) 5 is configured from an upper surface plate (plate, support structure) 5a which supports the lens barrel 2, a lower surface plate 5c which supports the upper surface plate 5a with multiple (for example, 4) support columns 5b, and a side plate 5d which seals a space interposed between the upper surface plate 5a and the lower surface plate 5c. Internal pressure in the chamber 5 is adjusted by a second vacuum pump 13 connected to a portion of the side plate 5d. The interior of the chamber 5 is also maintained at a high degree of vacuum identical to that of the lens barrel 2. Specifically, the degree of vacuum is, for example, on the level of $10^{-4}$ Pa in a state where there is no electron beam radiation. The chamber 5 is connected to an auxiliary exhaust chamber 14 that is adjacent to the side plate 5d. Although not illustrated in the drawing, the auxiliary exhaust chamber 14 is provided with a conveyance apparatus that conveys the substrate 3 inward and outward between the apparatus exterior on the atmosphere side and the substrate stage 4 on the vacuum side, and a vacuum pump that adjusts the internal pressure of the auxiliary exhaust chamber 14. By such provision with such an auxiliary exhaust chamber 14, the drawing apparatus 1 can conduct inward and outward conveyance of the substrate 3 while maintaining the interior of the chamber 5 in the state of vacuum. Furthermore, the chamber 5 is supported by multiple (for example, 4) mounts 15 that connect to the lower surface plate 5c, and the mounts 15 are supported by the base plate 8 that is laid on the floor surface. The mounts 15 are, for example, anti-vibration mechanisms such as air mounts, and have a blocking function so that propagation of vibration does not occur from the floor surface or base plate 8 to the chamber 5 side. In addition, the mounts 15 also conduct positioning of the chamber 5 as actuators, based on output signals detected by position sensors that are not illustrated in the drawing.

The chamber 5 is supported on the base plate 8 via the mounts 15, and the stage surface plate 10 is also supported on the base plate 8 via the multiple support columns 9. In order to establish a sealed interior space, the chamber 5 which is rendered mobile by the mounts 15 is provided with sealing members 20 that respectively correspond to the support positions of the multiple support columns 9. Firstly, the support columns 9 which support the stage surface plate 10 respectively pass through apertures 5e formed in the lower surface plate 5c without contact, and extend to the base plate 8. Particularly in the present embodiment, a bellows (extendable pipe) installed so that one end is fastened (with a sealed connection) to the aperture 5e of the lower surface plate 5c while the other end is fastened to the base plate 8 side is adopted as the sealing member 20. In this case, the multiple support columns 9 respectively pass through the interior pipe of a bellows without contact, whereby the sealing members 20 configure the boundary of the vacuum environment within the chamber 5 and the atmospheric environment.

Furthermore, the base plate 8 is provided with two support members (a first support member 21 and a second support member 22), and two rotary members (a first rotary member 23 and a second rotary member 24) at the connection region of the support column 9 and the sealing member 20. Firstly, the first support member 21 has a tapered surface (conical surface) that is inclined at a fixed angle from the vertical direction (Z axis direction) relative to the plane (XY plane) of the base plate 8 so as to fit into a recess that exists in the base plate 8 side. Otherwise, this first support member 21 may be an independent member, or it may be part of the distal end of the support column 9. The second support member 22 is a member that is positioned on the outside of the tapered surface of the first support member 21, and has a recess into which fits the first support member 21. In the same manner as the first support member 21, this second support member 22 also has a tapered surface that is inclined at a fixed angle from the vertical direction relative to the plane of the base plate 8 so as to fit into a recess that exists in the base plate 8. Furthermore, the first rotary member 23 is disposed in the region where the first support member 21 and the second support member 22 face each other, i.e., between the tapered surface of the first support member 21 and the recess surface of the second support member 22 that opposes this tapered surface. On the other hand, the second rotary member 24 is disposed in the region where the second support member 22 and the body of the base plate 8 face each other, i.e., between the tapered surface of the second support member 22 and the recess surface of the base plate 8 that opposes this tapered surface. These first and second rotary members 23 and 24 allow rotation in a rotational direction (ωZ direction) around an axis that parallels the axial direction of the support column 9 (the direction of extension or contraction of the sealing member 20) with little frictional force in this rotational direction. As the first rotary member 23 and the second rotary member 24, it is possible to adopt, for example, roller bearings, magnetic bearings, or rotating plate springs, and vacuum grease is applied to the interior contact surface in these cases. With such a configuration, the other end of the sealing member 20 that is fastened to the base plate 8 side in the above description is fastened to the surface (XY plane) of the second support member 22. That is, the base plate 8 and support column 9 are capable of relative rotation only in the ωZ direction relative to the second support member 22 to which the other end of the sealing member 20 is fixed. Otherwise, the present embodiment is configured so that the support members 21 and 22 are respectively disposed in the base plate 8, but a configuration is also possible in which, for example, they are directly disposed in the flooring on which the drawing apparatus 1 is disposed (laid). Furthermore, for reference purposes, in FIG. 1 (and similarly in the below-described FIG. 2), components of the chamber 5 and components that are connected and integrated with this chamber 5 are marked with diagonal lines.

The control unit is configured by, for example, a computer. The control unit is connected to the various components of the drawing apparatus 1 via circuitry, and is able to conduct control of the various components according to a program or the like. Otherwise, the control unit may also be integrally configured (within a shared casing) with the other parts of the drawing apparatus 1, or it may be separately configured (within a separate casing) from the other parts of the drawing apparatus 1.

Next, a description is given of the operations of the sealing member 20 and its peripheral structure in the drawing apparatus 1. During the period in which the drawing apparatus 1 conducts drawing processing, the interior of the chamber 5 is maintained at a high vacuum pressure by the evacuation of the second vacuum pump 13. Consequently, if no countermeasures are taken, it is possible that deformation may occur due to the air pressure differential between the interior and exterior. Moreover, if no countermeasures are taken, it is also possible that the lens barrel 2 that is coupled with the chamber 5 may receive vibration from the floor surface via the chamber 5. Furthermore, supposing that part of the substrate stage 4 contacts the chamber 5 via a support column 9, there is the possibility that deformation and vibration may be directly imparted to the chamber 5 from its reactive drive force. Now, when the support structure which supports a processing mechanism that directly conducts prescribed processing (the drawing processing of the present embodiment) such as the lens barrel 2 sustains the aforementioned external disturbance, positional deviation arises with respect to the optical system inside the lens barrel 2 as well as the interferometer 11 and the like, with the result that drawing accuracy and measurement accuracy are affected. Thus, in order to suppress deformation of the chamber 5 and vibration of the floor surface that could be propagated to the support structure, the drawing apparatus 1 of the present embodiment carries out the following operations.

Firstly, the vibration or force of the Z axis component and the ωZ axis component that arises in the floor surface or base plate 8 and that can be propagated directly to the chamber 5 is mitigated by the driving (movement) of the multiple mounts 15. At this time, if it were only a matter of the vibration or force of the Z axis component, the operation of the sealing member 20 would be capable of responding by extension and contraction in the Z axis direction. On the other hand, in the case where vibration or force arises in the ωZ direction in the floor surface or base plate 8, it is conceivable that such vibrational force would be transmitted to the chamber 5 via the sealing member 20. Thus, in the present embodiment, transmission of vibration or force in the ωZ axis direction to the second support member 22 is suppressed, because the second rotary member 24 suitably rotates to receive it. That is, as the second support member 22 itself does not move (or moves with difficulty) in the ωZ axis direction, transmission of vibration or force in the ωZ direction to the sealing member 20 that is fastened to this second support member 22 is also suppressed, which also results in mitigation of transmission to the chamber 5. Furthermore, as the support column 9 (substrate stage 4) is supported by the first support member 21 that is on the inner side of the second support member 22, its reception of ωZ directional vibration or force that arises in the floor surface or base plate 8 is inhibited. Next, with respect to ωZ directional vibration or force that arises due to reactive drive force of the substrate stage 4 and that could be transmitted to the chamber 5, transmission to the chamber 5 is mitigated, because the first rotary member 23 suitably rotates to receive it. As the converse of this, supposing the case where vibration or deformative force of the ωZ component arises in the chamber 5, transmission to the support columns 9 is mitigated, because the first rotary member 23 suitably rotates to receive it in the same manner.

Furthermore, the first support member 21 and the second support member 22 respectively sustain the loads of the support column 9 (substrate stage 4) and the sealing member 20 at their tapered surfaces in the vertical direction. Therefore, the relative direction of movement (displacement direction) between the first support member 21 and the second support member 22 as well as the relative direction of movement between the second support member 22 and the base plate 8 are in each case only in the ωZ rotational direction. By this means, the support column 9 in particular is maintained at the prescribed position even when supported by the base plate 8 via the first rotary member 23 and the second rotary member 24, and movement other than rotation in the ωZ direction is restricted. Otherwise, the "movement other than rotation in the ωZ direction" is motion in a direction parallel to a plane that is orthogonal to the direction of extension or contraction of the sealing member 22 and to an axis parallel to the direction of extension or contraction, and is rotation around an axis parallel to the aforementioned plane that is orthogonal.

In this manner, as the drawing apparatus 1 uses a configuration wherein a bellows with high rigidity in the ωZ direction is adopted as the sealing member 20, and propagation of vibration or force to the sealing member 20 in the ωZ direction is inhibited, propagation thereof to the support structure that supports the lens barrel 2 and the interferometer 11 is consequently also inhibited. Therefore, the drawing apparatus 1 can suppress effects on drawing accuracy, measurement accuracy, and the like that the rise from vibrational force transmitted via the chamber 5. Furthermore, as the drawing apparatus 1 adopts a bellows as the sealing member 20, it can more easily maintain a degree of vacuum within the chamber 5 compared to the case where, for example, a low-rigidity seal is adopted.

As described above, according to the present embodiment, it is possible to provide a processing apparatus which is advantageous for mitigating deformation, vibration, and the like that can be propagated via a chamber that has been internally accommodated to a specific environment.

Second Embodiment

Figure 2:
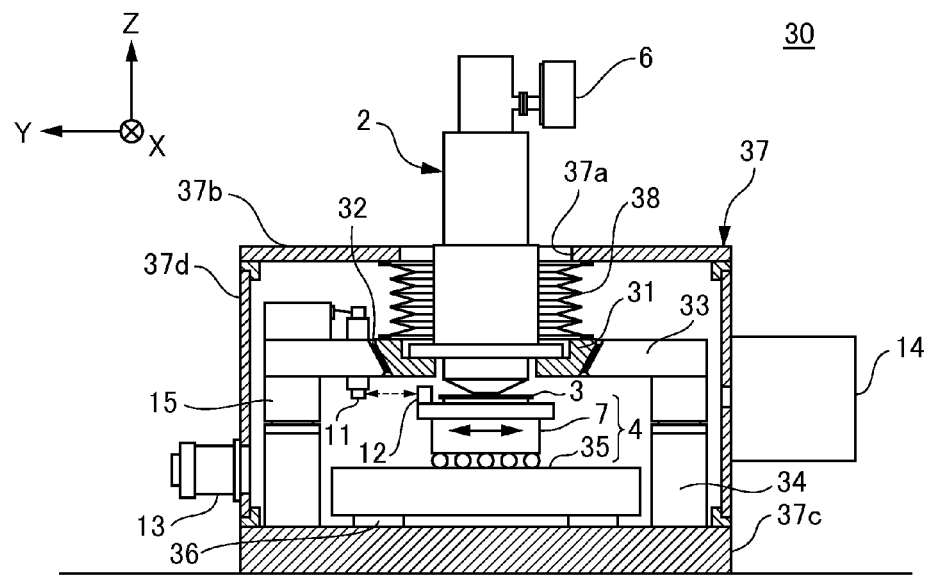
FIG. 2 is a diagram illustrating a configuration of a drawing apparatus of a second embodiment of the present invention.

Next, a description is given of a processing apparatus of a second embodiment of the present invention. The features of the processing apparatus of the present embodiment is that a sealing member and its peripheral configuration as in the first embodiment are applied in a case where the configuration of the drawing apparatus 1 of the first embodiment is changed, and the support structure that supports the lens barrel 2 is given a structure independent of the vacuum chamber. FIG. 2 is a schematic view which shows a configuration of a drawing apparatus 30 of the present embodiment. In FIG. 2, the same code numbers are assigned to components with the same configuration as in the drawing apparatus 1 of the first embodiment, and description thereof is omitted. In this case, the lens barrel 2 is supported by a support structure 33 via a support member 31 and a rotary member 32 described below, and this support structure 33 is supported, via the mounts 15, by multiple support columns 34 that are supported on a below-described lower surface plate 37c laid on the floor surface. A stage surface plate 35 is directly supported on the lower surface plate 37c by multiple support columns 36. A chamber 37 is configured from an upper wall partition 37b including an aperture 37a that passes through the lens barrel 2, the lower surface plate 37c, and a side plate 37d that supports the upper wall partition 37b, and that seals a space interposed between the upper wall partition 37b and the lower surface plate 37c.

In contrast to the chamber 5 of the first embodiment, the chamber 37 is supported on the lower surface plate 37c laid on the floor surface without interposition of the mounts 15, and is provided with a sealing member 38 for purposes of creating a sealed interior space in this case as well. This sealing member 38 is a bellows similar to that of the first embodiment, and is installed so that one end is fastened to the aperture 37a of the upper wall partition 37b, while the other end is fastened to the lower surface plate 37c side. The lens barrel 2 passes through the interior pipe of the bellows without contact, whereby the sealing member 38 configures a boundary between the vacuum environment within the chamber 37 and the atmospheric environment.

Furthermore, at the connection region with the sealing member 20, the support structure 33 is provided with a support member 31 that directly supports the lens barrel 2, and a rotary member 32. Firstly, the support member 31 has a tapered surface inclined at a fixed angle from a vertical direction relative to the plane of the support structure 33 so as to fit into a recess existing in the support structure 33 side. Furthermore, the rotary member 32 corresponds to the first rotary member 23 of the first embodiment, and is disposed in a region where the support member 31 and the support structure 33 opposing each other, i.e., between the tapered surface of the support member 31 and the recessed surface of the support structure 33 that opposes this tapered surface. This rotary member 32 allows rotation in a rotational direction (ωZ direction) around the Z axis which is the axial direction of the lens barrel 2 (the direction of extension or contraction of the sealing member 38) with little frictional force in this rotational direction. Under this configuration, in the above description, the other end of the sealing member 38 that is fastened to the support structure 33 side is fastened to the surface (XY plane) of the support member 31.

According to this configuration, firstly, vibration or force of the Z axis component that arises in the floor surface or lower surface plate 37c and that could be transmitted to the support structure 33 via the entire chamber 37 is mitigated by extension and contraction of the sealing member 38. On the other hand, in the case where vibration or force in the ωZ axis direction arises in the floor surface or lower surface plate 37c, it is conceivable that this vibration or force would be transmitted to the support structure 33 via the entire chamber 37 and the sealing member 20. Thus, in the present embodiment, transmission of vibration or force in the ωZ axis direction to the support structure 33 is suppressed, because the rotary member 32 suitably rotates to receive it. Moreover, supposing the case where vibration or deformative force of the ωZ component arises in the support structure 33, transmission to the lens barrel 2 and the chamber 37 is mitigated, because the rotary member 32 suitably rotates to receive it in the same manner. Furthermore, in the case of the present embodiment, the support member 31 sustains load at the tapered surface in the vertical direction of the lens barrel 2 and the sealing member 38. Therefore, the direction of relative movement between the support member 31 and the support structure 33 is only rotation in the ωZ direction. By this means, the lens barrel 2 in particular is maintained at the prescribed position even when supported by the support member 31 via the rotary member 32, and movement other than rotation in the ωZ direction is restricted.

In this manner, according to the present embodiment, the same effects as those of the first embodiment are obtained, and it is particularly advantageous in inhibiting effects on the measurement accuracy of the interferometer installed in the support structure 33 due to vibration or force in the ωZ direction transmitted from the chamber 37 side via the sealing member 38. Otherwise, according to the configuration of the present embodiment, there is the possibility that positional displacement may arise in the ωZ direction between the lens barrel 2 and the substrate stage 4 due to relative rotational movement between the support member 31 and the support structure 33. Even supposing that such positional displacement were to occur, it would be possible to respond in advance with correction control by, for example, measuring the position of a mirror (not illustrated in the drawing) located on the lens barrel 2 by laser light from the interferometer 11 disposed on the support structure 33.

Otherwise, in the above embodiments, a drawing apparatus was described as an example of a lithography apparatus, but the present invention is not limited thereto. As a lithography apparatus to which the present invention may be applied, it is also acceptable to use, for example, an exposure apparatus which is provided with a bellows for wall formation and which transfers an original pattern to a photosensitive substrate via a projection optical system by ultraviolet rays of ArF excimer laser light with a wavelength of 200 nm or less. The walls in this variation are used to form a specific interior space, e.g., to form a space with cleaner air, or to form a space of inert gas. On the other hand, the processing apparatus of the present invention is also not limited to a lithography apparatus, and if considered in terms of devices used in the manufacturing process of semiconductor devices are liquid crystal display devices, the contents of the present invention may be applied to a variety of devices that carry out a prescribed processing within a vacuum chamber. As such devices, there are, for example, film forming devices and etching devices.

Aspects of the present invention can also be realized by a computer of a system or apparatus (or devices such as a CPU or MPU) that reads out and executes a program recorded on a memory device to perform the functions of the above-described embodiments, and by a method, the steps of which are performed by a computer of a system or apparatus by, for example, reading out and executing a program recorded on a memory device to perform the functions of the above-described embodiments. For this purpose, the program is provided to the computer for example via a network or from a recording medium of various types serving as the memory device (e.g., computer-readable medium).

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-233558 filed on Oct. 23, 2012 which is hereby incorporated by reference herein in its entirety.

What is claimed is:

1. A processing apparatus configured to conduct a prescribed processing on an object to be processed in a specific environment, the processing apparatus comprising:
   a chamber configured to have an aperture and an interior accommodated to a specific environment;
   a mechanism of which at least a portion is contained within the chamber interior, while a remaining portion passes through the aperture without contacting the chamber;
   at least one support member configured to support the mechanism;
   a sealing member that configures a boundary of the specific environment and an atmospheric environment by connecting one end to the aperture and connecting the other end to the support member; and
   a rotary member configured to allow relative rotation around a vertical axis between the support member and a structure that supports the support member.

2. The processing apparatus according to claim 1, wherein the sealing member is an extendable pipe.

3. The processing apparatus according to claim 1, wherein the support member has a form that restricts motion other than rotation of the rotary member relative to the structure.

4. The processing apparatus according to claim 2, wherein the support member has a form that restricts motion other than rotation of the rotary member relative to the structure.

5. The processing apparatus according to claim 3, wherein the support member has a tapered surface that is inclined at a fixed angle from the vertical direction.

6. The processing apparatus according to claim 4, wherein the support member has a tapered surface that is inclined at a fixed angle from the vertical direction.

7. The processing apparatus according to claim 1, wherein the mechanism includes a movable holding unit configured to hold the object to be processed,
   wherein the structure is a member which is laid on a flooring or floor surface, and
   wherein the chamber includes a surface plate that supports a processing mechanism that directly conducts the processing, and is supported by the structure with interposition of vibration-proofing mechanisms.

8. The processing apparatus according to claim 7, wherein the support member includes a first support member as a part of the mechanism or as a portion connected to the mechanism, and a second support member configured to receive the first support member on its inner side and to connect to the other end of the sealing member, and
   wherein the rotary member includes a first rotary member configured to allow relative rotation of the first support member and the second support member, and a second rotary member configured to allow relative rotation of the second support member and the structure.

9. The processing apparatus according to claim 5, comprising a measurement unit which is disposed on a side surface of the specific environment in the surface plate, and configured to serve to measure a position of the holding unit.

10. The processing apparatus according to claim 1, wherein the mechanism is a processing mechanism which directly conducts the processing,
    wherein the structure includes a support structure which supports the processing mechanism inside the chamber, and
    wherein the chamber is supported independently of the support structure.

11. The processing apparatus according to claim 10, comprising:
    a movable holding unit which holds the object to be processed; and
    a measurement unit which is disposed in the support structure, and configured to measure a position of the holding unit.

12. The processing apparatus according to claim 1, wherein the specific environment is a vacuum environment.

13. The processing apparatus according to claim 7, wherein the specific environment is a vacuum environment, and
    wherein the processing mechanism is an electron optical system configured to draw on the object to be processed using charged particle beam.

14. The processing apparatus according to claim 10, wherein the specific environment is a vacuum environment, and
    wherein the processing mechanism is an electron optical system which serves to conduct drawing on the object to be processed using charged particle beam.

15. The processing apparatus according to claim 7, wherein the processing mechanism is a projection optical system configured to transfer an original pattern to the object to be processed.

16. The processing apparatus according to claim 10, wherein the processing mechanism is a projection optical system configured to transfer an original pattern to the object to be processed.

17. An article manufacturing method comprising:
    processing en an object to be processed using a processing apparatus; and
    developing the object to be processed that has been processed;
    wherein the processing apparatus is configured to conduct a prescribed processing on an object to be processed in a specific environment, the processing apparatus comprising:
      a chamber configured to have an aperture and an interior accommodated to a specific environment;
      a mechanism of which at least a portion is contained within the chamber interior, while a remaining portion passes through the aperture without contacting the chamber;
      at least one support member configured to support the mechanism;
      a sealing member that configures a boundary of the specific environment and an atmospheric environment by connecting one end to the aperture and connecting the other end to the support member; and a rotary member configured to allow relative rotation around a vertical axis between the support member and a structure that supports the support member.

* * * * *